United States Patent
Zhu

(10) Patent No.: US 10,886,380 B2
(45) Date of Patent: Jan. 5, 2021

(54) SEMICONDUCTOR STORAGE DEVICE AND METHOD FOR FORMING A PROFILE OF A CAPACITOR THEREOF

(71) Applicant: Changxin Memory Technologies, Inc., Anhui (CN)

(72) Inventor: Rongfu Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 16/732,471

(22) Filed: Jan. 2, 2020

(65) Prior Publication Data

US 2020/0144392 A1 May 7, 2020

Related U.S. Application Data

(63) Continuation of application No. PCT/CN2018/094525, filed on Jul. 4, 2018.

(30) Foreign Application Priority Data

Jul. 4, 2017 (CN) .......................... 2017 1 0539203

(51) Int. Cl.
*H01L 29/66* (2006.01)
*H01L 21/308* (2006.01)
(Continued)

(52) U.S. Cl.
CPC ...... *H01L 29/66181* (2013.01); *H01L 21/308* (2013.01); *H01L 28/60* (2013.01); *H01L 29/945* (2013.01)

(58) Field of Classification Search
CPC . H01L 29/66181; H01L 21/308; H01L 28/60; H01L 27/1085; H01L 29/945
See application file for complete search history.

(56) References Cited

U.S. PATENT DOCUMENTS 9,209,190 B2 12/2015 Chen et al.
9,385,129 B2 7/2016 Kang
(Continued)

FOREIGN PATENT DOCUMENTS

CN 102543964 A 7/2012
CN 104253019 A 12/2014
(Continued)

OTHER PUBLICATIONS

PCT International Search Report and the Written Opinion dated Oct. 9, 2018, issued in related International Application No. PCT/CN2018/094525 (8 pages).

*Primary Examiner* — Seahvosh Nikmanesh
(74) *Attorney, Agent, or Firm* — Sheppard Mullin Richter & Hampton LLP

(57) ABSTRACT

A method for forming a capacitor profile on a semiconductor is disclosed. The method includes: providing a semiconductor substrate; forming a dielectric layer on the semiconductor substrate; forming an ion reflecting mask layer on the dielectric layer; forming a plurality of patterned openings by etching through the ion reflecting mask layer to expose the dielectric layer; and forming a plurality of trenching capacitor profiles by etching through the dielectric layer from the plurality of patterned openings, respectively, to expose the semiconductor substrate. Each trenching capacitor profile includes a bowing profile formed at 75%-95% of a height of the trenching capacitor profile above the semiconductor substrate.

27 Claims, 9 Drawing Sheets

(51) Int. Cl.
*H01L 49/02* (2006.01)
*H01L 29/94* (2006.01)

(56) References Cited

U.S. PATENT DOCUMENTS

| | | |
|---|---|---|
| 9,711,508 B2 | 7/2017 | Yang et al. |
| 2004/0129961 A1 | 7/2004 | de Araujo et al. |
| 2013/0217203 A1 | 8/2013 | Kwon et al. |
| 2015/0102395 A1 | 4/2015 | Park et al. |
| 2017/0186837 A1 | 6/2017 | Yen et al. |

FOREIGN PATENT DOCUMENTS

| | | |
|---|---|---|
| CN | 105609403 A | 5/2016 |
| CN | 105932012 A | 9/2016 |
| CN | 107331655 A | 11/2017 |

SEMICONDUCTOR STORAGE DEVICE AND METHOD FOR FORMING A PROFILE OF A CAPACITOR THEREOF

CROSS-REFERENCE TO RELATED APPLICATION

This application is a continuation application of International Patent Application No. PCT/CN2018/094525, filed on Jul. 4, 2018, which is based on and claims priority to the Chinese Patent Application No. 201710539203.1, filed on Jul. 4, 2017 and entitled "SEMICONDUCTOR STORAGE DEVICE AND METHOD FOR FORMING A PROFILE OF A CAPACITOR THEREOF." The above-referenced applications are incorporated herein by reference in their entirety.

TECHNICAL FIELD

The present disclosure generally relates to semiconductor techniques, and more specifically, to semiconductor storage devices and methods for forming a profile of a capacitor thereof.

BACKGROUND

As a necessary and widely used component in integrated circuits, capacitors may perform functions such as voltage adjustment and filtering in the integrated circuits.

A horizontal capacitor usually consists of two plates and dielectric materials accommodated between the two plates. The capacitance of a capacitor may be proportional to the area of the plates and the dielectric constant (k) of the dielectric materials, and may be inversely proportional to the thickness of the dielectric materials. A problem associated with increasing the area of the plates is that it requires a larger physical area on a wafer or substrate of the capacitor, i.e., a larger chip area is occupied.

A vertical capacitor (or trench capacitor) may be fabricated by forming deep trenches within a substrate thereof. The vertical capacitor (or trench capacitor) may utilize sidewalls of the deep trenches to provide main areas for electrode plates, thereby reducing the occupied area of the capacitor on the chip surface and, simultaneously, achieving larger capacitance.

However, as the size of the capacitors become smaller and the depth of the trenches become larger, the opening size of the trenches need to be reduced, which may greatly increase an aspect ratio of the trench. The aspect ratio of a trench may be referred to as a ratio of the depth of the trench to the width of the trench. When etching the substrate to form a deep trench, as the aspect ratio of the trench becomes larger, the sidewalls of the trench may bear relatively strong plasma collisions, which may result in over-etching on the profiles of the capacitor.

One challenge with etching the trench with high aspect ratio is controlling and limiting a bowing effect that enlarges trench diameters or widths. Bowing is an enlargement of the trench diameter. A consequence of an enlarged bowing diameter is that when the dielectric materials are deposited on the side wall within the trench, adjacent trenches may merge, leading to electrical shorts. Therefore, it is desirable to provide a method to control the bowing effect.

SUMMARY

The purpose of the present disclosure is to provide a semiconductor storage device and methods for forming a profile of a capacitor thereof, which may facilitate the forming of vertical profile of the capacitor, reduce the occurrence of electrical shorts, and improve the performance of the semiconductor storage device.

A first aspect of the present disclosure is directed to a method for forming a capacitor profile on a semiconductor is provided. The method may include: providing a semiconductor substrate; forming a dielectric layer on the semiconductor substrate; forming an ion reflecting mask layer on the dielectric layer; forming a plurality of patterned openings by etching through the ion reflecting mask layer to expose the dielectric layer; and forming a plurality of trenching capacitor profiles by etching through the dielectric layer from the plurality of patterned openings, respectively, to expose the semiconductor substrate. Each trenching capacitor profile may include a bowing profile formed at 75%-95% of a height of the trenching capacitor profile above the semiconductor substrate.

In some embodiments, the bowing profile may be further formed at 80%-90% of the height of the trenching capacitor profile above the semiconductor substrate.

In some embodiments, a maximum diameter of the bowing profile may be less than or equal to 1.2 times of a maximum diameter of the trenching capacitor profile.

In some embodiments, the maximum diameter of the bowing profile may be less than or equal to 1.15 times of the maximum diameter of the trenching capacitor profile.

In some embodiments, the plurality of trenching capacitor profiles may be formed by dry etching.

In some embodiments, forming a plurality of trenching capacitor profiles by etching through the dielectric layer from the plurality of patterned openings may further include: applying plasma ions through the plurality of patterned openings; and forming the bowing profiles by reflected plasma ions via sidewalls of the plurality of patterned openings.

In some embodiments, the ion reflecting mask layer may have a thickness of 630 nm to 840 nm.

In some embodiments, the ion reflecting mask layer may be made of polysilicon.

In some embodiments, for each patterned opening, an aperture at an end of the patterned opening that is far from the dielectric layer is wider than an aperture at an end of the patterned opening that is close to the dielectric layer.

In some embodiments, forming a plurality of patterned openings may further include: forming a patterned mask layer on the ion reflecting mask layer; forming a plurality of grooves in the ion reflecting mask layer by a first etching process that etches a first portion of the ion reflecting mask layer through the patterned mask layer; forming the plurality of patterned openings by a second etching process that etches a second portion of the ion reflecting mask layer through the plurality of grooves; and removing the patterned mask layer.

In some embodiments, the first etching process and the second etching process may be dry etching.

In some embodiments, an etching rate of the second etching process may be higher than an etching rate of the first etching process.

In some embodiments, an etching gas of the first etching process and an etching gas of the second etching process may include hydrogen bromide, oxygen and fluorinated gas.

In some embodiments, the etching gas of the first etching process and the etching gas of the second etching process may include at least one of $CF_4$ or $NF_3$.

In some embodiments, the etching gas of the second etching process may not include $CF_4$.

In some embodiments, the fluorinated gas may include at least one of $C_4F_6$ or $C_4F_8$.

In some embodiments, for a groove of the plurality of grooves, an aperture at an end far from the dielectric layer may be substantially equal to an aperture at an end close to the dielectric layer.

In some embodiments, a ratio between the thickness of the second portion of the ion reflecting mask layer to the thickness of the ion reflecting mask layer may be 0.05 to 0.2.

In some embodiments, forming the dielectric layer on the semiconductor substrate may further include: providing a first nitride layer on the semiconductor substrate; providing a first oxide layer on the first nitride layer; providing a second nitride layer on the first oxide layer; providing a second oxide layer on the second nitride layer; and providing a third nitride layer on the second oxide layer.

In some embodiments, the etching gas to form the trenching capacitor profiles may include oxygen and fluorinated gas.

In some embodiments, the etching gas to form the trenching capacitor profiles may include $CHF_3$, $CH_2F_2$, and $C_4F_6$ for etching the third nitride layer.

In some embodiments, the etching gas to form the trenching capacitor profiles includes $NF_3$, $C_4F_6$, and $C_4F_8$ for etching the second oxide layer.

In some embodiments, the etching gas to form the trenching capacitor profiles includes $C_4F_8$, $CH_2F_2$, and $C_4F_6$ for etching the second nitride layer.

In some embodiments, the etching gas to form the trenching capacitor profiles includes $NF_3$, $C_4F_8$, and $C_4F_6$ for etching the first oxide layer.

In some embodiments, the etching gas to form the trenching capacitor profiles includes $C_4F_8$, $CH_2F_2$, and $C_4F_6$ for etching the first silicon nitride layer.

In some embodiments, the method may further include: forming first electrode within the plurality of trenching capacitor profiles; removing the dielectric layer and the ion reflecting mask layer; and forming a high dielectric layer and a second electrode on both inner surface and outer surface of the first electrode.

In some embodiments, the first electrode may include titanium nitride, the high dielectric layer includes titanium oxide or zirconium, and the second electrode includes polycrystalline silicon.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings.

DETAIL DESCRIPTION OF THE EMBODIMENTS

The following description is presented to enable any person skilled in the art to make and use the present disclosure and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not limited to some embodiments shown but is to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood, the operations of the flowchart may be implemented not in order. Conversely, the operations may be implemented in inverted order, or simultaneously. Moreover, one or more other operations may be added to the flowcharts. One or more operations may be removed from the flowcharts.

Figure 1:
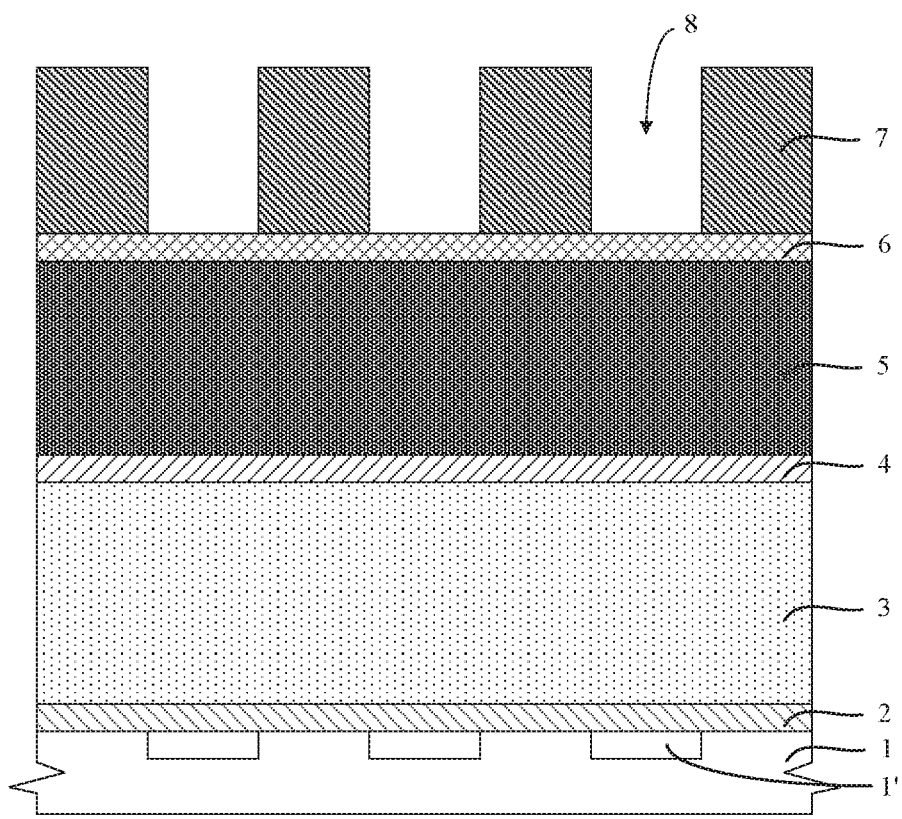
FIGS. 1, 2, and 3 are schematic diagrams illustrating various stages of a method for forming a capacitor.
Figure 2:
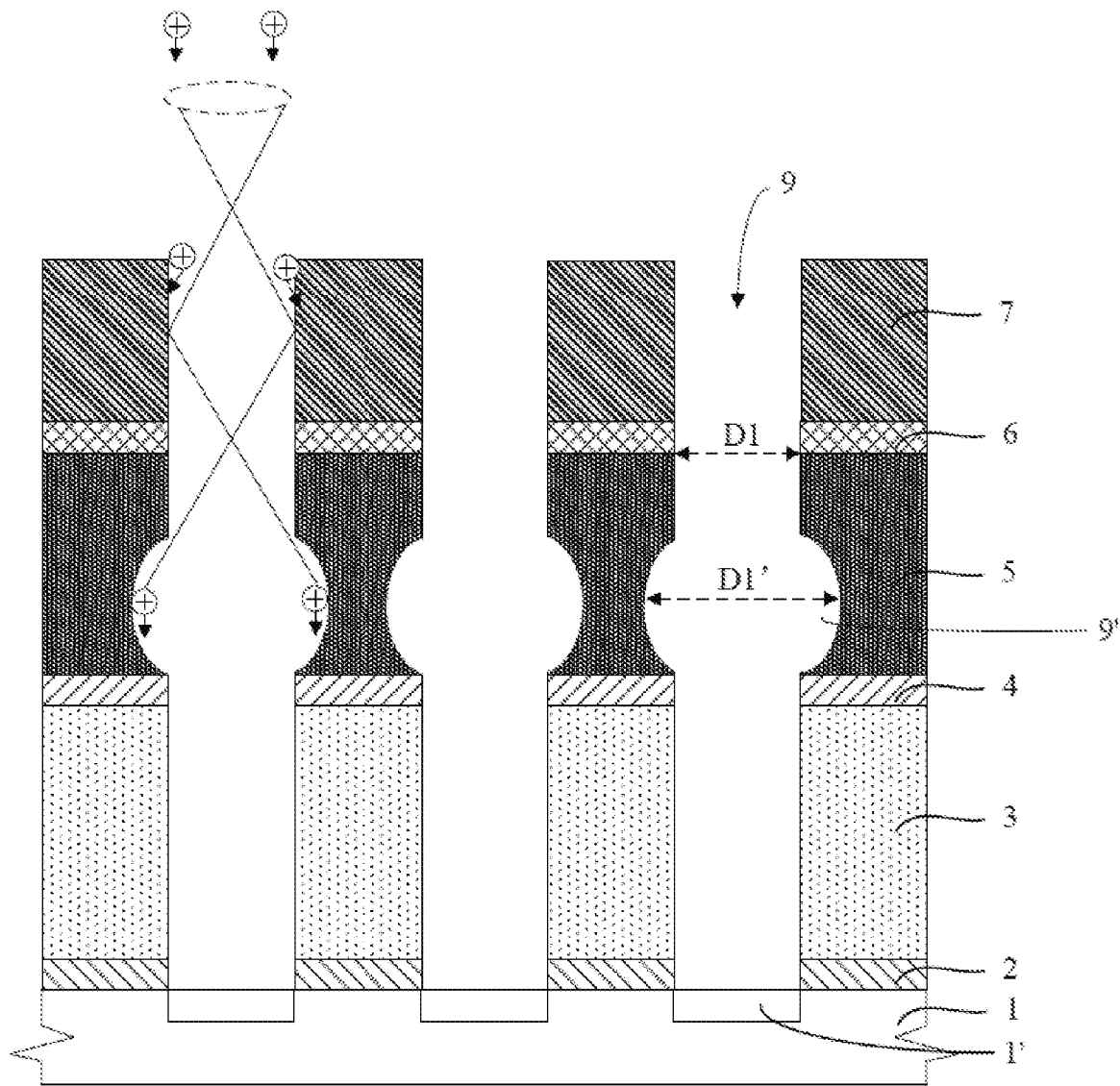
Figure 3:
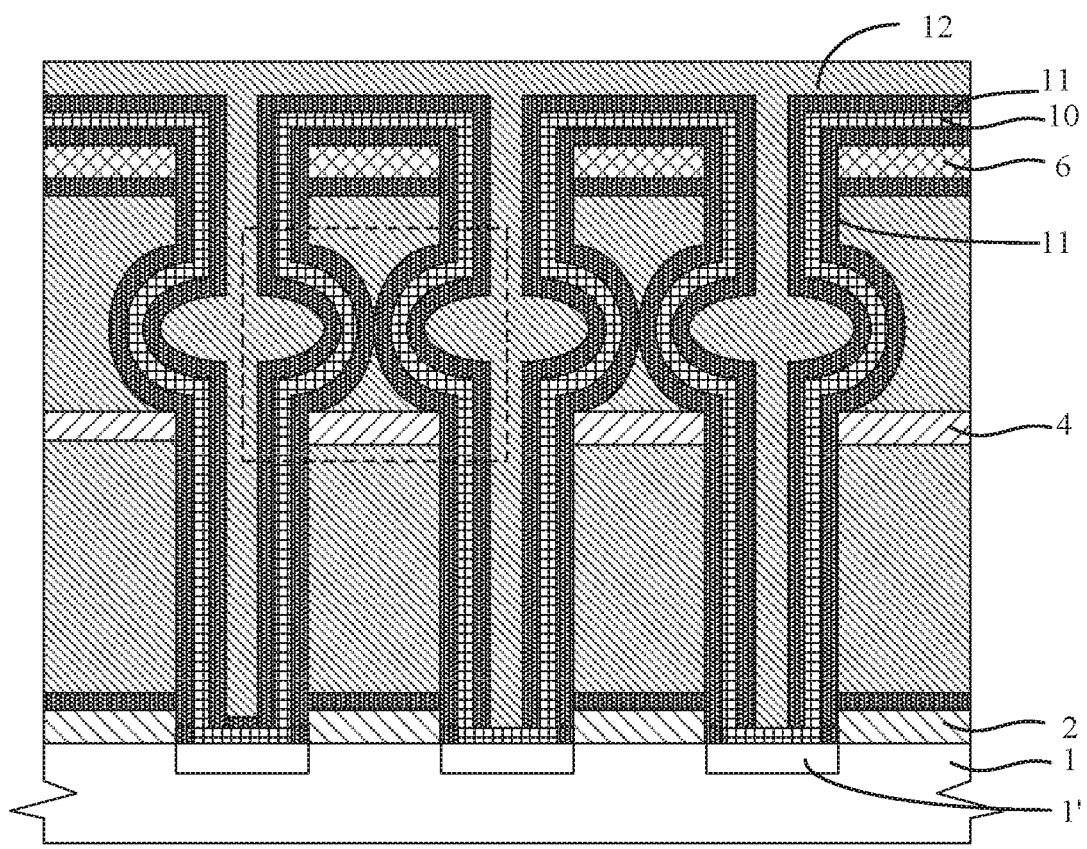

FIGS. 1, 2, and 3 are schematic diagrams illustrating various stages of a method for forming a capacitor. As illustrated in FIGS. 1, 2, and 3, the method for forming a capacitor may include following operations.

A substrate 1 may be provided, and a multi-layer structure may be formed on the substrate 1. The multi-layer structure may include, from the bottom up, a first silicon nitride layer 2, a first oxide layer 3, a second silicon nitride layer 4, a second oxide layer 5, a third silicon nitride layer 6 and an ion reflecting mask layer 7. The ion reflecting mask layer 7 may be made of polycrystalline silicon. The thickness of the ion reflecting mask layer 7 may range from 600 nm to 800 nm. Preferably, the thickness of the ion reflecting mask layer 7 may be about 700 nm. The first oxide layer 3 may include a material such as a boron phosphorus oxide. The second oxide layer 5 may include a material such as a silicon oxide. A connection component 1' may be formed on the upper surface of the substrate 1 before the multi-layer structure is formed. The connection component 1' may be a source region or a drain region formed on the substrate 1.

To etch the ion reflecting mask layer 7, a mask layer (not shown in the figure) may be formed on the ion reflecting mask layer 7. The mask layer may be etched to form a patterned mask layer, which may expose a portion of the ion reflecting mask layer 7 that is located in a predetermined region for forming a trench. Taking the patterned mask layer as a mask, the exposed portion of the ion reflecting mask layer 7 may be etched to form multiple capacitor patterned openings 8. The multiple capacitor patterned openings 8 may expose a portion of the third silicon nitride layer 6. The patterned mask layer may be removed to form the structure as shown in FIG. 1. An aperture of an end of a capacitor patterned opening 8 that is close to the third silicon nitride layer 6 may be approximately equal to an aperture of an end of the capacitor patterned opening 8 that is far from the third silicon nitride layer 6. That is, apertures of the capacitor patterned opening 8 at different depths may be consistent. The third silicon nitride layer 6, the second oxide layer 5, the second silicon nitride layer 4, the first oxide layer 3, and the first silicon nitride layer 2 may be etched in order through the capacitor patterned openings 8 to form a trench 9, which may expose the substrate 1 and form the structure as shown in FIG. 2.

The third silicon nitride layer 6, the second oxide layer 5, the second silicon nitride layer 4, the first oxide layer 3, and the first silicon nitride layer 2 may be etched by a dry etching process. The dry etching process may remove at least a portion of materials of the multi-layer structure by exposing these materials to a bombardment of ions formed by a plasma of reactive gases via the multiple capacitor patterned openings 8. In the process for etching the trench 9, the ions may have a reflection effect. The plasma ions that collide the sidewall of the ion reflecting mask layer 7 (more specifically, the capacitor patterned opening 8) may be reflected, resulting in over-etching on the sidewall of the second oxide layer 5 to form a bowing portion 9'. As shown in FIG. 2, an arrow may represent a trajectory of the plasma ions. The trench 9 may protrude to the outer surface of the trench 9 at 50% to 60% of the height of the trench 9 above substrate 1. A maximum aperture D1' of the trench 9 at the bow portion 9' may be 1.2 times of a maximum aperture D1 of the trench 9 other than the bowing portion 9'.

When dielectric materials (e.g., a nitride layer or an oxide layer) are deposited on the sidewall within the trench 9, the presence of the bowing portion 9' may lead to electrical shorts, shown as dotted lines in FIG. 3. Specifically, after the trench 9 is formed, a first electrode layer 10 may be formed on the sidewall within the trench 9. The ion reflecting mask layer 7 may be removed. The first oxide layer 3 and the second oxide layer 5 of the multi-layer structure may be removed. The second silicon nitride layer 4 may be reserved as a first supporting layer (also referred to as a middle supporting layer). The third silicon nitride layer 6 may be reserved as a second supporting layer (also referred as a top supporting layer). A high dielectric layer 11 may be formed within the trench 9 and cover the first electrode layer 10. A second electrode layer 12 may be formed within the trench 9 and cover the high dielectric layer 11. The first electrode layer 10, the second electrode layer 12, together with the high dielectric layer 11, may form a capacitor within the trench 9. The first electrode layer 10 may include a titanium nitride (TiN) layer, the high dielectric layer 11 may include a titanium oxide ($TiO_x$) layer or a zirconium oxide ($ZrO_x$) layer, and the second electrode layer 12 may include a polycrystalline silicon layer.

As mentioned above, due to the presence of the bowing portion 9', when the first electrode layer 10, the high dielectric layer 11 and the second electrode layer 12 are formed within the trench 9, adjacent capacitors may contact with each other and lead to an electrical short as shown in the dotted lines portion of FIG. 3, which may affect the performance of the semiconductor storage device.

According to some embodiments of the present disclosure, when fluorinated gas with a relative large molecular weight is introduced into the etching gas during plasma etching the third silicon nitride layer 6, the second oxide layer 5, the second silicon nitride layer 4, the first oxide layer 3, and the first silicon nitride layer 2, the sidewall of the capacitor patterned opening 8 of the ion reflecting mask layer 7 may absorb a portion of deviated reactive plasma ions and a reflection angle of the plasma particles that collide the sidewall of the capacitor patterned opening 8 may be reduced or eliminated. Therefore, the position of a formed bowing portion of the trench may be moved upward and the aperture thereof may be reduced, such that the profile of a capacitor may be more vertical, which may avoid the occurrence of electrical shorts between capacitors.

In some embodiments, the ion reflecting mask layer 7 may be etched twice. That is, one more etching process may be added. The aperture of the capacitor patterned opening 8 that is far from the third silicon nitride layer 6 may be larger than the aperture of the capacitor patterned opening 8 that is close to the third silicon nitride layer 6. That is, the capacitor patterned opening 8 may be a structure with a wider upper width and a narrower lower width. Therefore, the position of sidewall of the trench 9 that collided with moving plasma particles may move up. Correspondingly, the over-etched portion of trench 9 that will be subsequently formed may move upward, so does the bowing portion formed within trench 9 (i.e., the position of the bowing portion may be further away from the substrate 1 in comparison with prior arts), and the aperture of bowing portion may be reduced. Thus, the profile of capacitor may be more vertical, and the occurrence of electrical shorts between adjacent capacitors may be avoided. In some embodiments, the thickness of the ion reflecting mask layer 7 may be increased such that the collision of the plasma particles may occurred far away from the third silicon nitride layer 6, and the over-etching of the ion reflecting mask layer 7 can be avoided.

Figure 4:
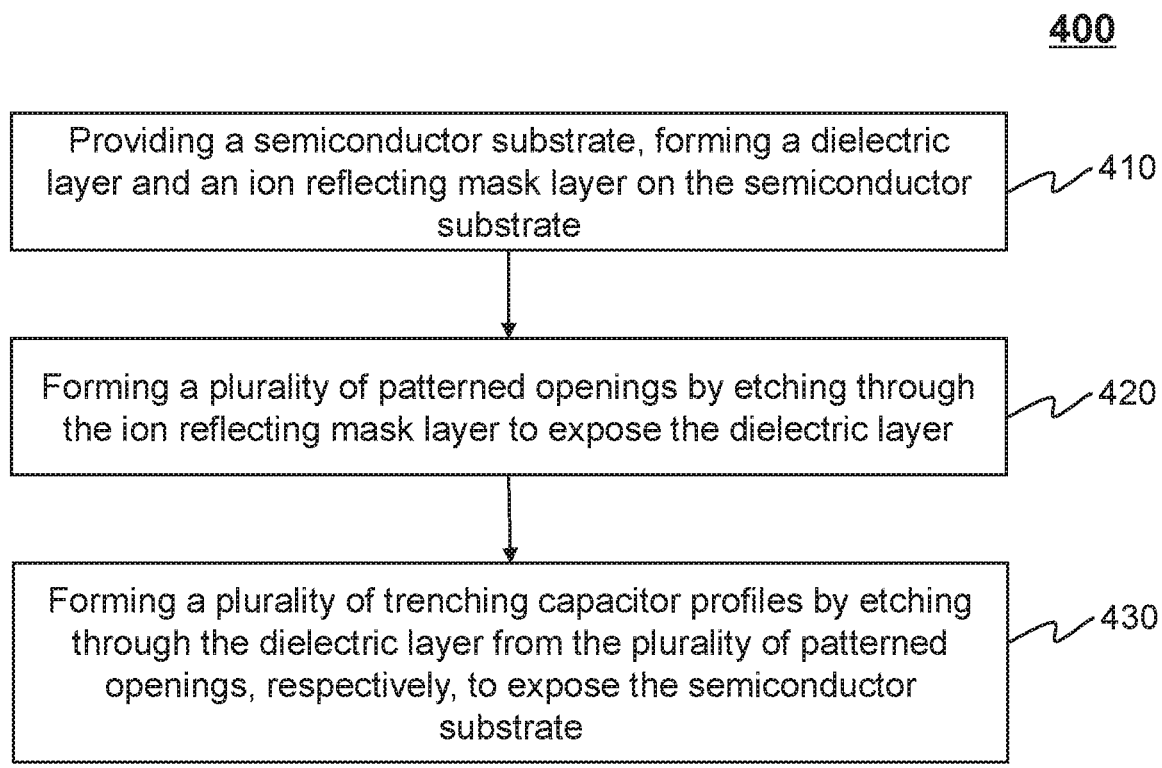
FIG. 4 is a flowchart illustrating an exemplary process for forming a profile of a capacitor of a semiconductor storage device according to some embodiments of the present disclosure.

FIG. 4 is a flowchart illustrating an exemplary process for forming a profile of a capacitor of a semiconductor storage device according to some embodiments of the present disclosure. The operations of the process presented below are intended to be illustrative. In some embodiments, the process 400 may be accomplished with one or more additional operations not described and/or without one or more of the operations herein discussed. Additionally, the order in which the operations of the process as illustrated in FIG. 4 and described below is not intended to be limiting.

In operation 410, a semiconductor substrate may be provided. In some embodiments, a dielectric layer and an ion reflecting mask layer may be formed in a predetermined order on the substrate. For example, the ion reflecting mask layer may be formed after the dielectric layer is formed.

In operation 420, the ion reflecting mask layer may be etched through to form a plurality of capacitor patterned openings. The capacitor pattern openings may expose the dielectric layer.

In operation 430, the dielectric layer may be etched through from the plurality of capacitor pattern openings to form a plurality of trenching capacitor profiles. The trenching capacitor profiles may expose the substrate. The dielectric layer may be etched by a plasma dry etching. The sidewalls of the plurality capacitor patterned openings of the ion reflecting mask layer may absorb a portion of deviated reactive plasma particles. The trenching capacitor profile may form a bowing profile at 70% to 95% of the height of the trenching capacitor profile. In some embodiments, the trenching capacitor profile may form a bowing profile at 75% to 95% of the height of the trenching capacitor profile. The maximum aperture of the trenching capacitor profile at the bowing profile may be less than or equal to 1.2 times of the maximum aperture of the trench out of the bowing profile.

Details of the capacitor and the forming method thereof of the present disclosure may be described in connection with flowcharts and schematic diagrams. The foregoing detailed disclosure may be intended to be presented by way of example and be not limiting. It should be understood that various alterations, improvements, and modifications may occur and are intended to those skilled in the art to achieve effects of the present disclosure.

Embodiments of the capacitor and the forming method thereof are for the purposes of describing the present disclosure in detail. It should be noted that the embodiments are not for limiting, and alterations, improvements, and modifications made by the skilled in art are within the spirit and scope of the exemplary embodiments of this disclosure.

FIGS. 5, 6, 7, 8, and 9 illustrate exemplary trenches of semiconductor storage device in each operation described in FIG. 4 according to some embodiments of the present disclosure. A fabrication process for the trenches of semiconductor storage device may be described in detail below with reference to FIG. 4 and FIGS. 5, 6, 7, 8, and 9.

Figure 5:
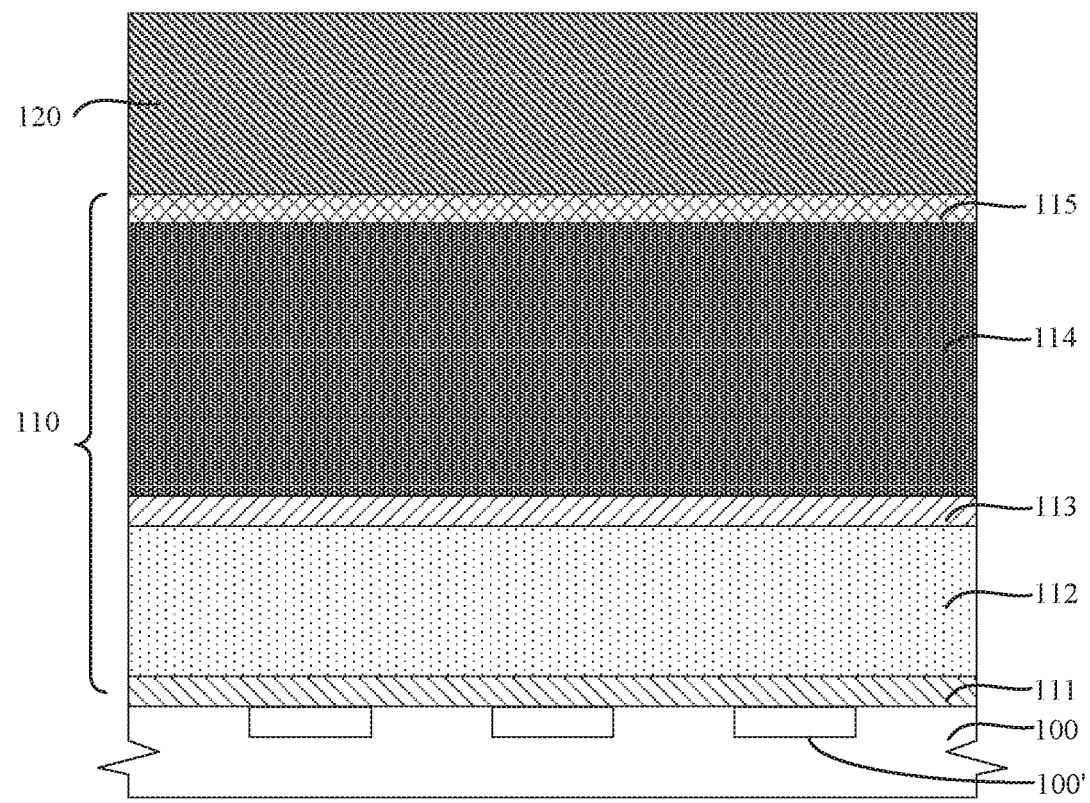
FIGS. 5, 6, 7, 8, 9 are schematic diagrams illustrating exemplary trenches of semiconductor storage device in each operation described in FIG. 4 according to some embodiments of the present disclosure.

As shown in FIG. 5, a substrate 100 may be provided. The substrate 100 may be made of monocrystalline silicon, polycrystalline silicon, amorphous silicon, Silicon-Germanium compounds, Silicon-on-Insulator (SOI), gallium arsenide, gallium nitride, or the like, or any combination thereof. It should be noted that the description of the substrate 100 is not limited to the situations mentioned above, and persons of ordinary skill in the art may make other modifications according to the practical scenario, and the substrate 100 may be made of any semiconductor material including any suitable semiconductor composition or combination of compositions. For example, the substrate 100 may be made essentially of monocrystalline silicon. Still for another example, the substrate 100 may be made essentially of monocrystalline silicon lightly doped with appropriate dopant. In some embodiments, at least one semiconductor structure may be formed in the substrate 100, including but not limited to a Shallow Trench Isolation (STI) structure, a doped region, a transistor, other semiconductor structures in the art, or any combination thereof. In some embodiments, at least one connection component 100' of a capacitor may be formed on the upper surface of the substrate 100. The connection component 100' may be configured to connect the substrate 100 or the semiconductor structure formed on the substrate 100. For example, the connection component 100' may be a drain region or a source region of a transistor formed on the substrate 100, or may be connected to the drain region or a source region of a transistor formed on the substrate 100.

Subsequently, a dielectric layer 110 and an ion reflecting mask layer 120 may be formed on the substrate 100 from the bottom up. The dielectric layer 110 may include a single homogeneous layer, or may include multiple layers. The dielectric layer 110 may be made of a silicon-containing material. In some embodiments, the silicon-containing material may include but not limited to silicon oxide, doped silicon oxides (e.g., borophosphosilicate glass (BPSG), phosphosilicate glass (PSG), fluorosilicate glass (FSG)), silicon nitride, or any combination thereof. In some embodiments, at least a portion of the dielectric layer 110 may be made of silicon oxide. For example, as illustrated in FIG. 5, the dielectric layer 110 may include, from the bottom up, a first silicon nitride layer 111, a first oxide layer 112, a second silicon nitride layer 113, a second oxide layer 114, and a third silicon nitride layer 115. The first oxide layer 112 and the second oxide layer 114 may be made of silicon oxide, doped silicon oxides, boron-phosphorus oxide, borophosphosilicate glass (BPSG), or any combination thereof. Preferably, the first oxide layer 112 may be made of BPSG, and the second oxide layer 114 may be made of silicon oxide. The ion reflecting mask layer 120 may be made of monocrystalline silicon, polycrystalline silicon, amorphous silicon, Silicon-Germanium compounds, Silicon-on-Insulator (SOI), gallium arsenide, gallium nitride, or any combination thereof. Preferably, the ion reflecting mask layer 120 may be made of polycrystalline silicon.

In some embodiments, the first silicon nitride layer 111, the first oxide layer 112, the second silicon nitride layer 113, the second oxide layer 114, and the third silicon nitride layer 115 may be formed on the substrate 100 subsequently from the bottom up. Then the ion reflecting mask layer 120 may be formed on the third silicon nitride layer 115. In some embodiments, the first silicon nitride layer 111, the first oxide layer 112, the second silicon nitride layer 113, the second oxide layer 114, the third silicon nitride layer 115, and the ion reflecting mask layer 120 may be formed on the substrate 100 by chemical vapor deposition (CVD) or physical vapor deposition (PVD), or any combination thereof. The CVD may include but not limited to atmospheric pressure CVD (APCVD), low pressure CVD (LPCVD), ultrahigh vacuum CVD (UHVCVD), aerosol assisted CVD (AACVD), direct liquid injection CVD (DLICVD), hot wall CVD, cold wall CVD, microwave plasma-assisted CVD (MPCVD), plasma-Enhanced CVD (PECVD), remote plasma-enhanced CVD (RPECVD), atomic-layer CVD (ALCVD), hot filament CVD (HFCVD), catalytic CVD (Cat-CVD), hybrid physical-chemical vapor deposition (HPCVD), metalorganic CVD (MOCVD), rapid thermal CVD (RTCVD), vapor-phase epitaxy (VPE), photo-initiated CVD (PICVD), CVD (LCVD), or any combination thereof. The PVD may include but not limited to cathodic arc deposition (Arc-PVD), electron beam PVD (EBPVD), evaporative deposition, pulsed laser deposition (PLD), sputter deposition, pulsed electron deposition, sublimation sandwich method. In some embodiments, the second oxide layer 114 may be formed by thermal oxide technique. In some embodiments, the dielectric layer 110 and the ion reflecting mask layer 120 may be formed by other techniques known by persons having ordinary skills in the art. It should be appreciated that layers included in the dielectric layer 110 and ion reflecting mask layer 120 may be formed by the same technique or formed by different techniques, and the present disclosure is not intended to be limiting.

In some embodiments, the ion reflecting mask layer 120 may have a thickness of 630 nm to 840 nm. It should be noted that the thickness of the ion reflecting mask layer 120 may be at least 5% (preferably 5%) more than the thickness of the ion reflecting mask layer 7 described above (e.g., as described in FIGS. 1, 2, and 3). The increase of the thickness of the ion reflecting mask layer 120 may prevent the ion reflecting mask layer 120 from being over-etched (e.g., be penetrated) in subsequent etching process(es) (e.g., a first etching process and a second etching process to be described below). In some embodiments, the ion reflecting mask layer 120 may have the thickness of 600 nm to 800 nm. Preferably, the ion reflecting mask layer 120 may have a thickness of 630 nm to 840 nm such as 630 nm, 735 nm, 840 nm. More preferably, the thickness of the ion reflecting mask layer 120 may be 735 nm. It should be appreciated that the thickness of the ion reflecting mask layer 120 mentioned above is for illustration purpose and the present disclosure is not intended to be limiting. In some embodiments, the thickness of the ion reflecting mask layer 120 may be adjusted according to specific application scenarios.

Figure 7:
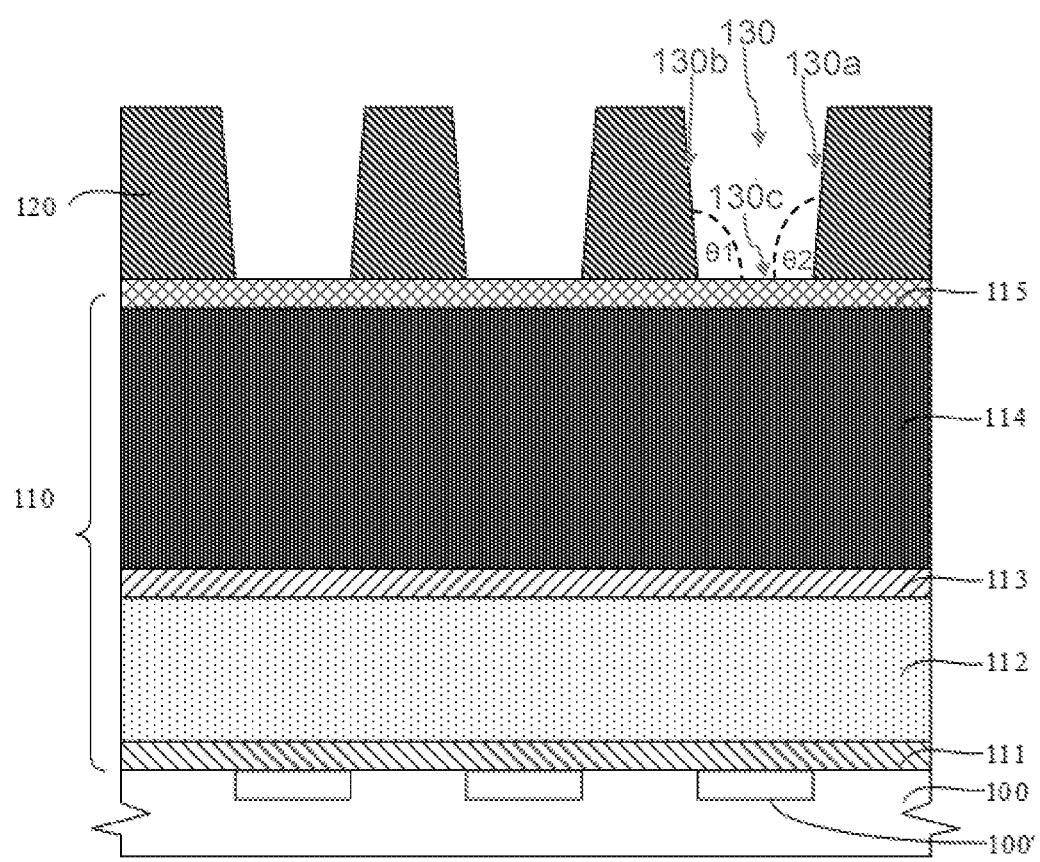

Subsequently, as described in FIG. 4, the ion reflecting mask layer 120 may be etched according to operation 420 described in FIG. 4. As shown in FIG. 7, at least one capacitor patterned opening 130 may be formed subsequently after at least a portion of operation 420 is performed according to some embodiments of the present disclosure. The capacitor patterned opening(s) 130 may expose at least a portion of the dielectric layer 110.

Figure 6:
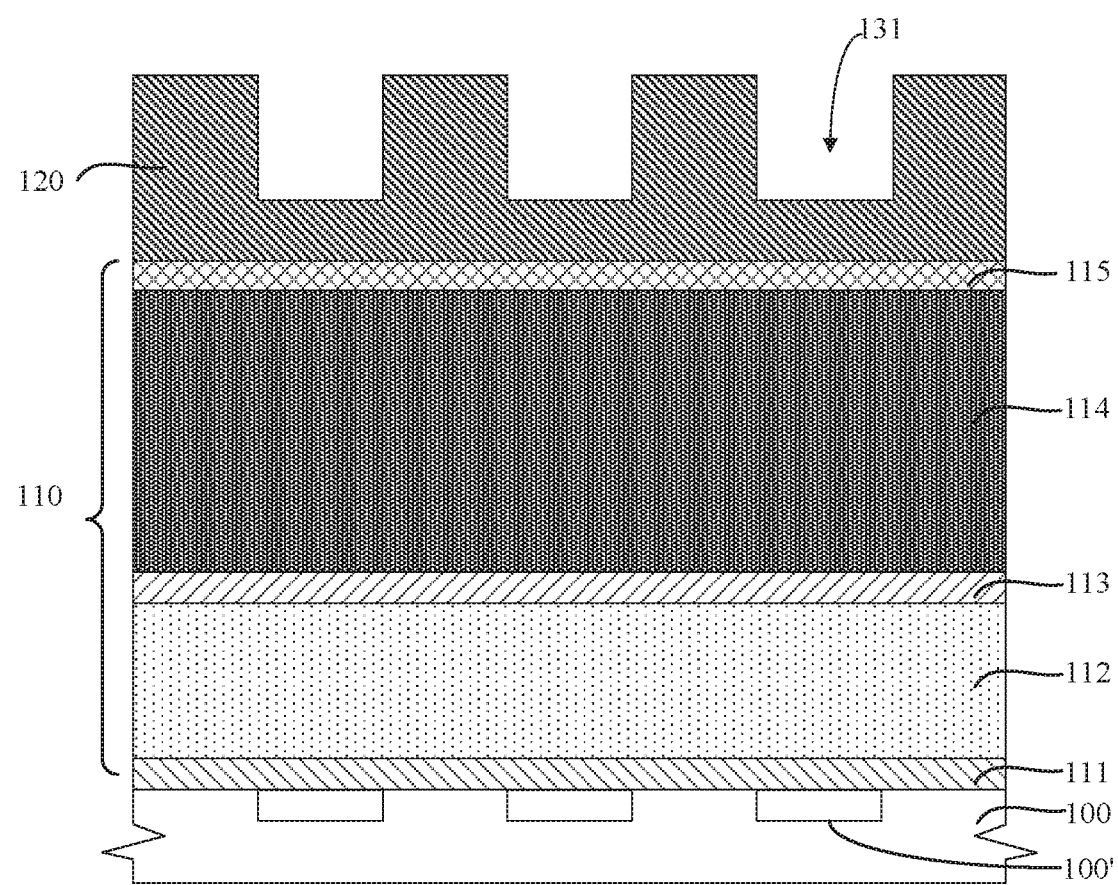

Detailed description related to the operation 420 may be described below. A mask layer (not shown in FIG. 7) may be formed on the ion reflecting mask layer 120. In some embodiments, the mask layer may be an oxide layer, e.g., a silicon oxide layer. Next, a photoresist layer may be formed on the mask layer. The photoresist layer may be patterned by exposing and developing the photoresist layer to form a patterned photoresist layer. The patterned photoresist layer may be considered as a mask for etching the mask layer, and a patterned mask layer may be formed by etching the mask layer based on the patterned photoresist layer. Further, a first etching process may be performed to etch the ion reflecting mask layer 120 using the patterned mask layer as a mask. At least one groove 131 within the ion reflecting mask layer 120 may be formed by the first etching process, as shown in FIG. 6. In some embodiments, the groove 131 may have a constant width for an entire depth of the groove 131. That is, an aperture at an end of each groove 131 that is far from the dielectric layer 110 may be equal to an aperture at an end at the groove 131 that is close to the dielectric layer 110. In some embodiments, as shown in FIG. 6, aperture(s) of opening(s) of the groove(s) 131 in a direction perpendicular to a surface of the substrate 100 may be the same. Sidewalls of the groove(s) 131 may be perpendicular to the surface of the substrate 100.

The groove(s) 131 may be formed within the ion reflecting mask layer 120 by plasma dry etching techniques. The groove(s) 131 may not totally penetrate through the ion reflecting mask layer 120. That is, a part (e.g., a lower part) of the ion reflecting mask layer 120 (also referred to as "etched ion reflecting mask layer") may remain intact. Accordingly, the dielectric layer 110 (e.g., the third silicon nitride layer 115) may not be exposed. An etching gas used for etching the ion reflecting mask layer 120 (also referred to as "first etching process") by the plasma dry etching techniques may include hydrogen bromide (HBr), oxygen, a fluorinated gas, or any combination thereof. In the present disclosure, the term "fluorinated gas" may be referred to as a gas that includes fluorine. For example, the fluorinated gas may include but not limited to carbon tetrafluoride ($CF_4$), nitrogen trifluoride ($NF_3$), or any combination thereof. In some embodiments, an aperture at an end of each groove 131 that is far from the dielectric layer 110 may be equal to an aperture at an end of the groove 131 that is close to the dielectric layer 110. That is, the aperture of the groove 131 may be the same through the entire depth of the groove 131 (i.e., the diameters of the cross-section of the groove 131 may be the same along a direction perpendicular to a surface of the substrate 100). Accordingly, the first etching process may be longitudinal etching. In some embodiments, all the sidewalls of the groove(s) 131 may be perpendicular to a horizontal plane of the dielectric layer 110 or perpendicular to the upper surface of the substrate 100. After the first etching process, the thickness of the remaining portion of the ion reflecting mask layer 120 may depend on etching conditions of the first etching process. For example, the thickness of the remaining portion of the ion reflecting mask layer 120 may be 5%-20% of a total thickness of the ion reflecting mask layer 120.

Subsequently, a second etching process may be performed to etch the ion reflecting mask layer 120 using the patterned mask layer as a mask. The remaining portion of the ion reflecting mask layer 120 under the groove 131 (i.e., the portion of the ion reflecting mask layer 120 that survives the first etching process) may be etched to form one or more capacitor patterned openings 130 via the second etching process. As shown in FIG. 7, the capacitor patterned opening(s) 130 may completely penetrate the etched ion reflecting mask layer 120, and the dielectric layer 110 (e.g., the third silicon nitride layer 115) may be exposed.

In some embodiments, the second etching process may be plasma dry etching. An etching gas used in the second etching process may include hydrogen bromide (HBr), oxygen, fluorinated gases, etc. In some embodiments, the fluorinated gas may include $C_xF_y$, nitrogen trifluoride ($NF_3$), etc., wherein x and/or y may be a positive integer greater than or equal to 1. In some embodiments, the fluorinated gas used in the first etching may be different from the fluorinated gas used in the second etching. For example, an etching rate of the fluorinated gas for etching the ion reflecting mask layer 120 in the second etching process may be greater than an etching rate of the fluorinated gas for etching the ion reflecting mask layer 120 in the first etching process. Accordingly, if the fluorinated gas used in the first etching is carbon tetrafluoride ($CF_4$) (i.e., $C_xF_y$, with x=1, and y=4), and the fluorinated gas used in the second etching is $CF_y$, then y may be not 4. For example, the fluorinated gas used in the second etching may include Hexachlorobutadiene ($C_4F_6$), tetrafluorocyclobutane ($C_4F_8$), or any combination thereof.

In some embodiments, an aperture at an end of each capacitor patterned opening 130 that is far from the dielectric layer 110 or the substrate 100 may be wider than an aperture at an end of the capacitor patterned opening 130 that is close to the dielectric layer 110 or the substrate 100. That is, an upper part of the capacitor patterned opening 130 may be wider than a lower part of the capacitor patterned opening 130. A part of at least one sidewall (e.g., an upper part that is away from the substrate 100) of the capacitor patterned opening 130 may slant outward. That is, an angle (e.g., θ1 or θ2 as illustrated in FIG. 7) between the part of at least one sidewall of the capacitor patterned opening 130 and an upper surface of the dielectric layer 110 (e.g., the third silicon nitride layer 115) or the substrate 100 may be greater than 90°, which is configured to change a trajectory of plasma ion during an etching process for forming a trenching capacitor profile 140. Thus, positions of the bowing portion formed by bombardment of the plasma ion on the sidewalls may move upward. Correspondingly, positions of the over-etching portion may move upward (i.e., move further away from the substrate 100). Detailed descriptions of the subsequent process can be found elsewhere in the present disclosure (e.g., in connection with operation 430 illustrated below).

The shape of a cross section (i.e., a section parallel to the upper surface of the substrate 100) of each capacitor patterned opening 130 may be circle, oval, quadrangle, polygon, etc. The shape of a longitudinal section (i.e., a section perpendicular to the upper surface of the substrate 100) of each capacitor patterned opening 130 may be a tapered shape such as isosceles inverted trapezoid. It should be appreciated that angles (e.g., θ1 or θ2 as illustrated in FIG. 7) between all sidewalls of the capacitor patterned opening 130 and the upper surface of the dielectric layer 110 (e.g., the third silicon nitride layer 115) may be greater than 90°. In some embodiments, as shown in FIG. 7, the angle between wall 130a and wall 130c (θ2 as illustrated in FIG. 7) and the angle between wall 130b and the wall 130c (θ1 as illustrated in FIG. 7) may both be larger than 90°, and the angle between the wall 130a and the wall 130c may be equal to the angle between the wall 130b and the wall 130c. Accordingly, the capacitor patterned opening 130 may be symmetric. In some embodiments, as shown in FIG. 7, the angle between the wall 130a and the wall 130c (θ2 as illustrated in FIG. 7) and the angle between the wall 130b and the wall 130c (θ1 as illustrated in FIG. 7) are larger than 90° respectively, and the angle between the wall 130a and the wall 130c may be different form the angle between the wall 130b and the wall 130c (i.e., the wall 130a and the wall 130b may have different inclinations). Accordingly, the capacitor patterned opening(s) 130 may be asymmetric. In some embodiments, an angle between one wall of the capacitor patterned opening 130 and the wall 130c may be greater than 90°. For example, an angle between the wall 130a and the wall 130c may be greater than 90°, an angle between the wall 130b and the wall 130c may be 90° (i.e., the wall 130b is perpendicular to the wall 130c). Accordingly, the capacitor patterned opening(s) 130 may be asymmetric.

In some embodiments, the capacitor patterned opening(s) 130 may have substantially same shapes and sizes, thereby capacitors formed in subsequence process may have substantially same capacitances. In some embodiments, the capacitor patterned opening(s) 130 may have different shapes and sizes. For example, at least one sidewall of some portion of the capacitor patterned openings 130 may slant outward (e.g., an upper part of the at least one wall may be wider than a lower part of the at least one wall), these capacitor patterned openings may be referred to as tapered opening. Sidewalls of some portion of the capacitor patterned openings 130 may be perpendicular to the upper surface of the dielectric layer 110 (e.g., the third silicon nitride layer 115), and the corresponding capacitor patterned opening(s) 130 may be referred to as vertical openings. In some embodiments, the tapered openings and the vertical openings may be alternately distributed.

Figure 8:
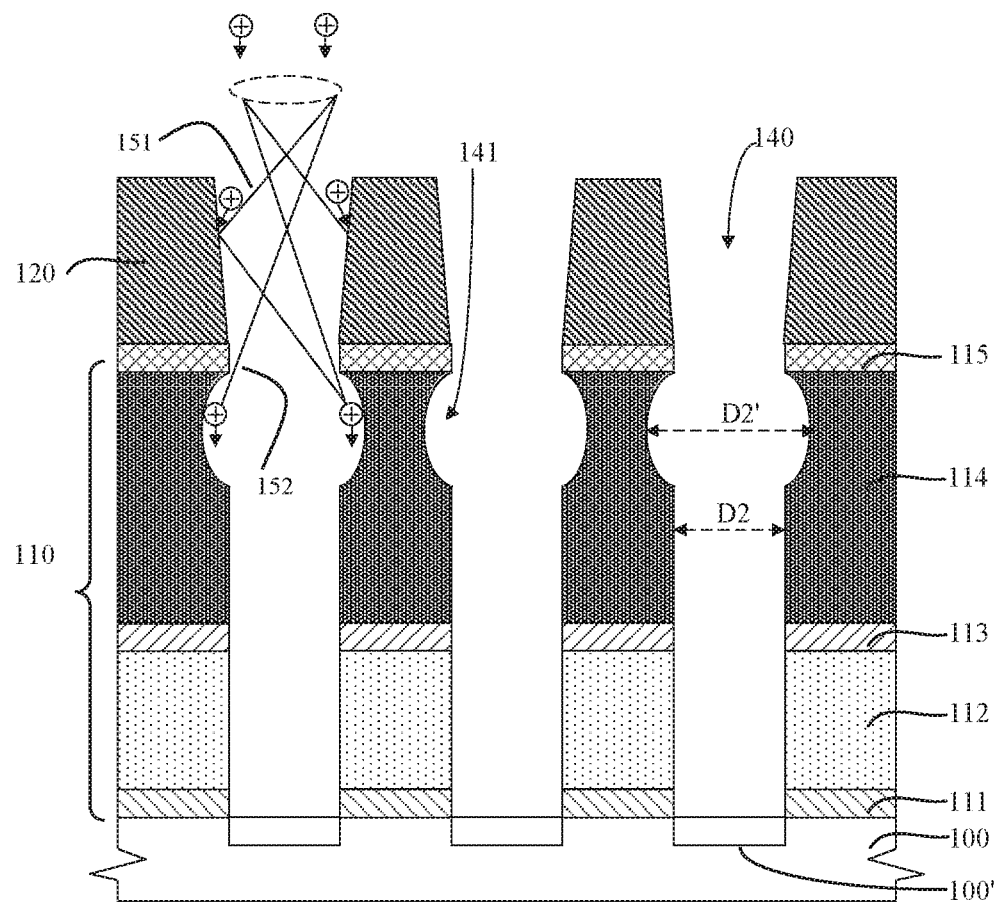

Subsequently, as illustrated in FIG. 8, the dielectric layer 110 may be etched according to operation 430 described in FIG. 4 according to some embodiments of the present disclosure. As illustrated in FIG. 8, at least one trenching capacitor profile 140 may be formed after the operation 430 is performed. The substrate 100 may be exposed by the at least one trenching capacitor profile 140.

The etching process performed according to the operation 430 may be a plasma dry etching process. A plasma etch may have a chemical-based part (or reactive part) and a physical-based part. The chemical-based part of the plasma etch may rely on chemical interaction of etching components (e.g., plasma ion) with material to cause a reaction that removes the material. The physical-based part of the plasma etch may rely on impact of energetic etch components to the material to displace portions the material. Generally, the trajectory of plasma ions is parallel to the surface normal of the substrate, by which a trench with vertical profile may be formed. In some embodiments, the trajectory of the plasma ions may deviate from the surface normal. For example, the trajectory of the plasma ions may deviate from the surface normal due to a collision between the plasma ion and neutral in the plasma sheath. For another example, charge buildup along the sidewalls of trenching capacitor profile 140 may also deflect incoming plasma ions causing the trajectory of the plasma ion deviating from the surface normal. A widen part (a bowing portion) of the trench may be formed due to the lateral etching by bombardments of the deviated plasma ions. For example, as illustrated in FIG. 8, a bowing profile 141 within the trenching capacitor profile 140 may be formed.

The sidewalls of the capacitor patterned opening(s) 130 of the ion reflecting mask layer 120 may absorb at least a portion of the deviated plasma ions which are related to the reactive part of the dry etching process, or reflect at least a portion of the deviated plasma ions. Accordingly, the bowing profile 141, bulging from the trenching capacitor profile 140 due to over-etching may be formed at 70%-95% of the total height of the trenching capacitor profile 140. In some embodiments, the bowing profile 141 may be formed at 75%-95% of the total height of the trenching capacitor profile 140. A maximum aperture of each trenching capacitor profile 140 at the bowing profile 141 may be less than or equal to 1.2 times of a maximum aperture of the trenching capacitor profile 140 at positions other than the bowing profile 141. In some embodiments, a shape of longitudinal section (i.e., a section perpendicular to the upper surface of the substrate 100) at the bowing profile 141 may include semicircle, semi oval, etc. Shapes and sizes of each trenching capacitor profile 140 at the bowing profile 141 may be the same or different. In some embodiments, the shapes and sizes of each trenching capacitor profile 140 at the bowing profile 141 may be the same.

Specifically, the dielectric layer 110 may be etched based on the capacitor patterned opening(s) 130, and at least one trenching capacitor profile 140 may be formed. The trenching capacitor profile(s) 140 may be formed by etching through the third silicon nitride layer 115, the second oxide layer 114, the second silicon nitride layer 113, the first oxide layer 112 and the first silicon nitride layer 111 successively. In some embodiments, the dielectric layer 110 may be etched by plasma dry etching techniques. In some embodiments, an etching gas used for etching the third silicon nitride layer 115 may include fluorinated gases, oxygen, etc. Exemplary fluorinated gases may include but not limited to trifluoromethane ($CHF_3$), difluoromethane ($CH_2F_2$), hexafluorobutadiene ($C_4F_6$), etc. In some embodiments, an etching gas used for etching the second oxide layer 114 may include fluorinated gases, oxygen, etc. Exemplary fluorinated gases may include but not limited to nitrogen trifluoride ($NF_3$), hexafluorobutadiene ($C_4F_6$), etc. In some embodiments, an etching gas used for etching the second silicon nitride layer 113 may include fluorinated gases, oxygen, etc. Exemplary fluorinated gases may include but not limited to octafluorocyclobutane ($C_4F_8$), difluoromethane ($CH_2F_2$), hexafluorobutadiene ($C_4F_6$), etc. In some embodiments, an etching gas used for etching the first oxide layer 112 may include fluorinated gases, oxygen, etc. Exemplary fluorinated gases may include but not limited to nitrogen trifluoride ($NF_3$), Octafluorocyclobutane ($C_4F_8$), hexafluorobutadiene ($C_4F_6$), etc. Thus the trenching capacitor profile 140 exposing the substrate 100 may be formed eventually. It should be appreciated that at least one parameter associated with the etching described above may be adjusted according to etching gases, etching machines, thickness of a layer, or any combination thereof. Exemplary parameters may include etching time, pressure, etc. The etching process for forming the trenching capacitor profile 140 described above are merely for illustration purpose and the present disclosure is not intended to be limiting.

As shown in FIG. 8, arrows represent a movement trajectory of plasma ions. Since a fluorinated gas with a relatively large molecular weight (e.g., Hexachlorobutadiene ($C_4F_6$), tetrafluorocyclobutane ($C_4F_8$)) may be used for etching at least one layer of the dielectric layer 110 using plasma dry etching techniques, plasma ions with relatively large deflection angle (e.g., plasma ions represented by trajectory 151 as shown in FIG. 8) may be absorbed by the ion reflecting mask layer 120. The reflection angle of the plasma ions with relatively large deflection angle (e.g., plasma ions represented by trajectory 151 as shown in FIG. 8) may be decreased or eliminated, thereby reducing or eliminating rebound of plasma ion on the sidewall of the ion reflecting mask layer 120. The plasma ions with relatively small deflection angle (e.g., plasma ions represented by trajectory 152 as shown in FIG. 8) that collide sidewalls of the ion reflecting mask layer 120 at the first time may cause over-etching at a position of the second oxide layer 114 that is relatively close to the third silicon nitride layer 115. Therefore, the position of each bowing profile 141 relative to the trenching capacitor profile 140 may move upward and a maximum aperture D2' of the trenching capacitor profile 140 at the bowing profile 141 may be decreased.

In comparison with FIG. 8 and FIG. 3, as the thickness of the ion reflecting mask layer 120 increases, the plasma ions may collide at a position which is relatively far away from the dielectric layer 110. As shown in FIG. 7, an upper part of each capacitor patterned opening 130 may be wider than the lower part of the capacitor patterned opening 130, and side walls of the capacitor patterned opening 130 may have a same inclination or different inclinations. Thus, the position on the side walls to which the plasma particles collide may move upward. Correspondingly, the position where the trenching capacitor profile(s) 140 are etched may move upward, thereby moving the bowing profile(s) 141 upward (i.e., relatively further away from the substrate 100).

In some embodiments of the present disclosure, the bowing profile 141 may be located at 70% to 95% of a height of the trenching capacitor profile 140. In some embodiments of the present disclosure, the bowing profile 141 may be located at 75% to 95% of a height of the trenching capacitor profile 140. A maximum aperture D2' of the trenching capacitor profile 140 at bowing profile 141 may be less than or equal to 1.2 times of a maximum aperture of the trenching capacitor profile 140 at positions other than the bowing profile 141. The aperture of the trenching capacitor profile 140 at the bowing profile 141 according to some embodiments of the present disclosure may be decreased, and the position of the bowing profile 141 relative to the trench of the present disclosure may move upward, thereby avoiding electrical shorts.

Figure 9:
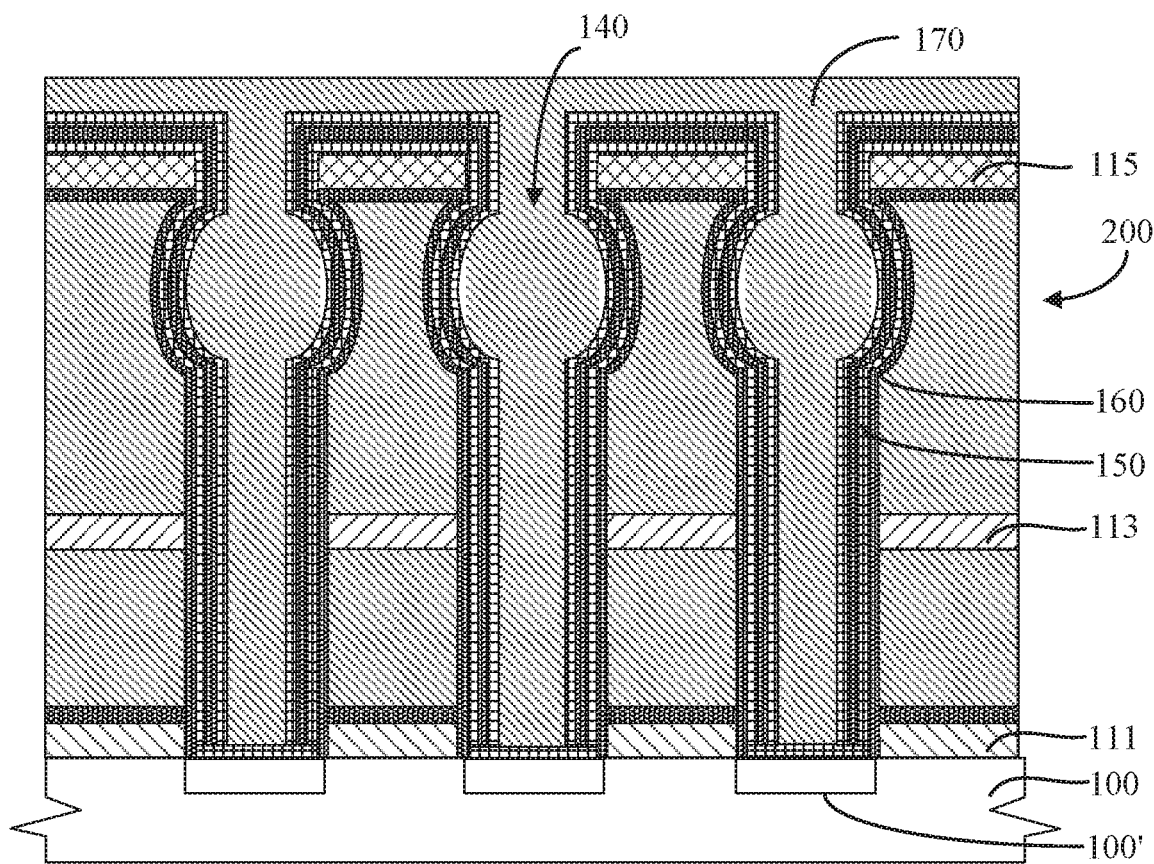

In some embodiments, the bowing profile 141 may be at 80% to 90% of a height of the trenching capacitor profile 140. In some embodiments, a maximum aperture (e.g., D2' as shown in FIG. 8) of each trenching capacitor profile 140 at the bowing profile 141 may be less than or equal to 1.15 times of a maximum aperture of the trenching capacitor profile 140 at positions other than the bowing profile 141 (e.g., D2 as shown in FIG. 8). Thereby electrical shorts between adjacent capacitors may be avoided after the capacitors are formed by filling at least one dielectric layer (e.g., a nitride layer, an oxide layer) inside the trenching capacitor profile(s) 140 as shown in FIG. 9.

After the trenching capacitor profile 140 is formed, the fabrication process for the semiconductor storage device may further include the following operations. As shown in FIG. 9, a first electrode layer 150 may be formed within the trenching capacitor profile 140. In some embodiments, the shape of the electrode layer 150 may be a U shape. The ion reflecting mask layer 120 and at least a portion of the dielectric layer 110 may be removed. In some embodiments, the first oxide layer 112 and the second oxide layer 114 included in the dielectric layer 110 may be removed, and the second silicon nitride layer 113 and the third silicon nitride layer 115 may be retained as a first supporting layer and a second supporting layer, respectively. Further, a high dielectric layer 160 may be formed on both inner surface and outer surface of the first electrode layer 150. A second electrode layer 170 may be formed on both inner surface and outer surface of the high dielectric layer 160. In some embodiments, the first electrode layer 150 may be titanium nitride (TiN) layer. In some embodiments, the high dielectric layer 160 may include titanium oxide ($TiO_x$) layer, zirconium oxide ($ZrO_x$) layer, etc. In some embodiments, the second electrode layer 170 may be a polycrystalline silicon layer.

It should be appreciated that the term "far from" and "close to" described in the present disclosure may be a relative concept. For example, an end of a trench that is far from a dielectric layer may refer to an end that is relatively further away from the dielectric layer than an end of the trench that is close to the dielectric layer. As another example, an end of the trench that is close to a dielectric layer may refer to an end that is relatively nearer to the dielectric layer than an end of the trench that is far from the dielectric layer.

In the fabrication process for semiconductor storage device described in the present disclosure, the dielectric layer 110 and the ion reflecting mask layer 120 may be subsequently formed on the substrate 100 from bottom to up. The capacitor patterned opening(s) 130 may be formed by etching the ion reflecting mask layer 120. A portion of the dielectric layer 110 may be exposed by the capacitor patterned opening(s) 130. Further, the trenching capacitor profile 140 may be formed by etching the dielectric layer 110 through the capacitor patterned opening(s) 130 using plasma etching technique. The substrate 100 may be exposed by the trenching capacitor profile 140. Walls of capacitor patterned opening(s) 130 of the ion reflecting mask layer 120 may absorb at least a portion of deviated reactive plasma ions. Bowing profile 141 may be formed at 70% to 95% of the height of the trenching capacitor profile 140. In some embodiments, bowing profile 141 may be formed at 75% to 95% of the height of the trenching capacitor profile 140. The trenching capacitor profile 140 may protrude at the bowing portion. A maximum aperture D2' of the trenching capacitor profile 140 at the bowing profile 141 may be less than or equal to 1.2 times of a maximum aperture of the trench at positions other than the bowing profile 141. In comparison with capacitor in prior arts, the diameter of the bowing portion may be decreased and the relative height of the bowing portion to the trench may be increased according to some embodiments of the present disclosure, thereby making the trenches of the semiconductor storage device relatively more vertical. Accordingly, electrical shorts between the capacitors may be avoided and the performance of the semiconductor storage device may be improved.

The present disclosure may also provide a semiconductor storage device formed by the fabrication process described above. The semiconductor storage device may include a substrate and a capacitor. The capacitor may be formed on the substrate. The capacitor may include a first electrode layer, a high dielectric layer, and a second electrode layer. An outer surface of the first electrode layer may have a shape of trenches of the capacitor. A bowing portion may be formed at 70% to 95% of the height of the first electrode layer. In some embodiments, the bowing portion may be formed at 75% to 95% of the height of the first electrode layer. The trench may protrude at the bowing portion. A maximum aperture of the first electrode layer at the bowing portion may be less than or equal to 1.2 times of a maximum aperture of the first electrode layer at positions other than the bowing portion.

As shown in FIGS. 8 and 9, the semiconductor storage device may include the substrate 100 and the capacitor 200 formed on the substrate 100. The capacitor 200 may include the first electrode layer 150, the high dielectric layer 160, and the second electrode layer 170. The first electrode layer 150 may include a shape of the outer surface of the trenching capacitor profile 140. Bowing profile 141 may be formed at a position with a height ranges from 70% to 95% of the height of the first electrode layer 150. In some embodiments, bowing profile 141 may be formed at a position with a height ranges from 75% to 95% of the height of the first electrode layer 150. The trenching capacitor profile 140 may protrude at the bowing profile 141. A maximum aperture D2' of the first electrode layer 150 at the bowing profile 141 may be less than or equal to 1.2 times of a maximum aperture D2 of the first electrode layer 150 at positions other than the bowing profile 141.

In some embodiments, the bowing profile 141 may be located at 80% to 90% of the height of the first electrode layer 150. A maximum aperture D2' of the first electrode layer 150 at the bowing profile 141 may be less than or equal to 1.15 times of a maximum aperture D2 of the first electrode layer 150 at positions other than the bowing profile 141.

As shown in FIG. 9, the semiconductor storage device may further include, from bottom to up, at least one connection component 100', the first silicon layer 111, the second electrode layer 170, and the substrate 100. The second electrode layer 170 may include the first supporting layer (e.g., the second silicon layer 113) and the second supporting layer (e.g., the third silicon nitride layer 115).

Since the aperture of the first electrode layer 150 at the bowing portion may be decreased, the position of the bowing profile 141 relative to the trenches may move upward, thereby making the trenches of the semiconductor storage device relatively more vertical. Accordingly, electrical shorts between the capacitors may be avoided and the performance of the semiconductor storage device may be improved.

In the fabrication process for the semiconductor storage device and the trenches thereof, a dielectric layer and an ion reflecting mask layer may be formed on a substrate. At least one capacitor patterned opening may be formed by etching the ion reflecting mask layer. The dielectric layer may be exposed by the capacitor patterned opening. Further, at least one trench may be formed by etching the dielectric layer through the capacitor patterned opening(s) using plasma etching techniques. The substrate may be exposed by the trench(es). Sidewalls of the capacitor patterned opening(s) of the ion reflecting mask layer may absorb at least a portion of deviated reactive plasma ions. At least one bowing portion may be formed at 70% to 95% of the height of the capacitor patterned opening(s) above the substrate. In some embodiments, the at least one bowing portion may be formed at 75% to 95% of the height of the capacitor patterned opening(s) above the substrate. The capacitor patterned opening(s) may protrude at the bowing portion. A maximum aperture of each trenching capacitor profile 140 at the bowing portion may be less than or equal to 1.2 times of a maximum aperture of the trenching capacitor profile 140 at positions other than the bowing portion. Since the aperture of the first electrode layer 150 at the bowing profile may be decreased, the position of each bowing profile relative to the trench may move upward, thereby making the trenches of the semiconductor storage device relatively more inclined to vertical. Accordingly, short circuits between the capacitors may be avoided and the performance of the semiconductor storage device may be improved.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with some embodiments is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof.

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may further be implemented as a software-only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claimed subject matter may lie in less than all features of a single foregoing disclosed embodiment.

The invention claimed is:

1. A method for forming a capacitor profile on a semiconductor, comprising:
provproviding a semiconductor substrate;
forming a dielectric layer on the semiconductor substrate;
forming an ion reflecting mask layer on the dielectric layer;
forming, by etching through the ion reflecting mask layer, a plurality of patterned openings to expose the dielectric layer; and
forming, by etching through the dielectric layer from the plurality of patterned openings, respectively, a plurality of trenching capacitor profiles to expose the semiconductor substrate,
wherein each trenching capacitor profile includes a bowing profile formed at 75%-95% of a height of the trenching capacitor profile above the semiconductor substrate.

2. The method of claim 1, wherein the bowing profile is further formed at 80%-90% of the height of the trenching capacitor profile above the semiconductor substrate.

3. The method of claim 1, wherein a maximum diameter of the bowing profile is less than or equal to 1.2 times of a maximum diameter of the trenching capacitor profile.

4. The method of claim 3, wherein the maximum diameter of the bowing profile is less than or equal to 1.15 times of the maximum diameter of the trenching capacitor profile.

5. The method of claim 1, wherein the plurality of trenching capacitor profiles are formed by dry etching.

6. The method of claim 1, wherein forming, by etching through the dielectric layer from the plurality of patterned openings, respectively, a plurality of trenching capacitor profiles further includes:
applying plasma ions through the plurality of patterned openings; and
forming the bowing profiles by reflected plasma ions via sidewalls of the plurality of patterned openings.

7. The method of claim 1, wherein the ion reflecting mask layer has a thickness of 630 nm to 840 nm.

8. The method of claim 1, wherein the ion reflecting mask layer is made of polysilicon.

9. The method of claim 1, wherein, for each patterned opening, an aperture at an end of the patterned opening that is far from the dielectric layer is wider than an aperture at an end of the patterned opening that is close to the dielectric layer.

10. The method of claim 8, wherein forming a plurality of patterned openings further includes:
forming a patterned mask layer on the ion reflecting mask layer;
forming, by a first etching process that etches a first portion of the ion reflecting mask layer through the patterned mask layer, a plurality of grooves in the ion reflecting mask layer;
forming, by a second etching process that etches a second portion of the ion reflecting mask layer through the plurality of grooves, the plurality of patterned openings; and
removing the patterned mask layer.

11. The method of claim 10, wherein the first etching process and the second etching process are dry etching.

12. The method of claim 10, wherein an etching rate of the second etching process is higher than an etching rate of the first etching process.

13. The method of claim 10, wherein an etching gas of the first etching process and an etching gas of the second etching process include hydrogen bromide, oxygen and fluorinated gas.

14. The method of claim 13, wherein the etching gas of the first etching process and the etching gas of the second etching process include at least one of $CF_4$ or $NF_3$.

15. The method of claim 13, wherein the etching gas of the second etching process do not include $CF_4$.

16. The method of claim 14, wherein the fluorinated gas includes at least one of $C_4F_6$ or $C_4F_8$.

17. The method of claim 10, wherein for a groove of the plurality of grooves, an aperture at an end far from the dielectric layer is substantially equal to an aperture at an end close to the dielectric layer.

18. The method of claim 10, wherein a ratio between a thickness of the second portion of the ion reflecting mask layer to a thickness of the ion reflecting mask layer is 0.05 to 0.2.

19. The method of claim 1, wherein forming the dielectric layer on the semiconductor substrate further includes:
providing a first nitride layer on the semiconductor substrate;
providing a first oxide layer on the first nitride layer;
providing a second nitride layer on the first oxide layer;
providing a second oxide layer on the second nitride layer; and
providing a third nitride layer on the second oxide layer.

20. The method of claim 19, wherein an etching gas to form the trenching capacitor profiles includes oxygen and fluorinated gas.

21. The method of claim 20, wherein the etching gas to form the trenching capacitor profiles includes $CHF_3$, $CH_2F_2$, and $C_4F_6$ for etching the third nitride layer.

22. The method of claim 20, wherein the etching gas to form the trenching capacitor profiles includes $NF_3$, $C_4F_6$, and $C_4F_8$ for etching the second oxide layer.

23. The method of claim 20, wherein the etching gas to form the trenching capacitor profiles includes $C_4F_8$, $CH_2F_2$, and $C_4F_6$ for etching the second nitride layer.

24. The method of claim 20, wherein the etching gas to form the trenching capacitor profiles includes $NF_3$, $C_4F_8$, and $C_4F_6$ for etching the first oxide layer.

25. The method of claim 20, wherein the etching gas to form the trenching capacitor profiles includes $C_4F_8$, $CH_2F_2$, and $C_4F_6$ for etching the first silicon nitride layer.

26. The method of claim 1, further including:
forming first electrode within the plurality of trenching capacitor profiles;
removing the dielectric layer and the ion reflecting mask layer; and forming a high dielectric layer and a second electrode on both inner surface and outer surface of the first electrode.

27. The method of claim 26, wherein the first electrode includes titanium nitride, the high dielectric layer includes titanium oxide or zirconium, and the second electrode includes polycrystalline silicon.

* * * * *